US009970709B2

(12) United States Patent
Ebner et al.

(10) Patent No.: US 9,970,709 B2
(45) Date of Patent: May 15, 2018

(54) FURNACE WITH A CONVECTION AND RADIATION HEATING

(71) Applicant: ADPV CIGS LTD., Apia (WS)

(72) Inventors: Robert Ebner, Leonding (AT); Bernard Jones, Leonding (AT); Alfred Spitzenberger, Leonding (AT); Uwe Keim, Grabenstetten (DE)

(73) Assignee: ADPV Cigs Ltd., Apia (WS)

( * ) Notice: Subject to any disclaimer, the term of this patent is extended or adjusted under 35 U.S.C. 154(b) by 159 days.

(21) Appl. No.: 15/072,821

(22) Filed: Mar. 17, 2016

(65) Prior Publication Data

US 2016/0290719 A1    Oct. 6, 2016

Related U.S. Application Data

(63) Continuation of application No. PCT/EP2014/070580, filed on Sep. 25, 2014.

(30) Foreign Application Priority Data

Sep. 27, 2013   (GB) .................................. 1317170.7

(51) Int. Cl.
*F27B 13/02*    (2006.01)
*F27B 9/06*    (2006.01)
(Continued)

(52) U.S. Cl.
CPC ................ *F27B 9/062* (2013.01); *F27B 9/20* (2013.01); *F27B 9/24* (2013.01); *F27B 9/28* (2013.01);
(Continued)

(58) Field of Classification Search
CPC .. F27B 13/02; F27B 9/02; F27B 9/029; F27B 9/10
See application file for complete search history.

(56) References Cited

U.S. PATENT DOCUMENTS 4,767,324 A  *  8/1988  Hitch ...................... F27B 9/028
                                                432/144
6,091,055 A  *  7/2000  Naka ..................... F27B 9/2476
                                                219/388

(Continued)

FOREIGN PATENT DOCUMENTS

JP          01-167582 A1    7/1989

OTHER PUBLICATIONS

International Search Report and Written Opinion (Application No. PCT/EP2014/070580) dated Sep. 25, 2014.

*Primary Examiner* — Gregory A Wilson
(74) *Attorney, Agent, or Firm* — Burr & Brown, PLLC

(57) ABSTRACT

The present invention relates to a furnace, in particular a continuous furnace, for controlling a temperature of at least one substrate. A housing of the furnace comprises an intake opening and an outtake opening, wherein between the intake opening and the outtake opening a temperature-controlled section is formed. A carrier element for carrying the at least one substrate is movable along a transport direction through the intake opening into the temperature-controlled section and from the temperature-controlled section through the outtake opening. A temperature controlling element is thermally coupled to the temperature-controlled section for controlling the temperature of the temperature-controlled section. The temperature-controlled section comprises a gas inlet through which a gas is blowable for controlling the temperature of the temperature-controlled section.

21 Claims, 2 Drawing Sheets

(51) Int. Cl.
   *F27B 9/20*      (2006.01)
   *F27B 9/24*      (2006.01)
   *F27B 17/00*     (2006.01)
   *H01L 21/67*     (2006.01)
   *H01L 21/677*    (2006.01)
   *F27B 9/28*      (2006.01)
   *F27D 19/00*     (2006.01)

(52) U.S. Cl.
   CPC ...... *F27B 17/0025* (2013.01); *H01L 21/6776* (2013.01); *H01L 21/67109* (2013.01); *H01L 21/67248* (2013.01); *H01L 21/67259* (2013.01); *H01L 21/67784* (2013.01); *F27D 2019/0071* (2013.01)

(56) References Cited

U.S. PATENT DOCUMENTS

| | | |
|---|---|---|
| 6,336,755 B1 | 1/2002 | Sanada et al. |
| 2008/0014543 A1* | 1/2008 | Fujio ................ C03B 29/08 432/122 |
| 2009/0075225 A1* | 3/2009 | Nakagiri ............ C03B 29/08 432/18 |
| 2013/0034821 A1* | 2/2013 | Lopez ................ F27B 9/243 432/128 |

\* cited by examiner

FURNACE WITH A CONVECTION AND RADIATION HEATING

CROSS REFERENCE TO RELATED APPLICATIONS

This application is a continuation of International Application No. PCT/EP2014/070580 filed Sep. 25, 2014, which designated the United States, and claims the benefit under 35 USC § 119(a)-(d) of British Application No. 1317170.7 filed Sep. 27, 2013, the entireties of which are incorporated herein by reference.

FIELD OF THE INVENTION

The present invention relates to a furnace, in particular, a continuous furnace, comprising several temperature controlling elements which are arranged inside a temperature-controlled section for controlling a temperature of the temperature-controlled section to control a temperature of a (coated) substrate. Furthermore, the present invention relates to a method for tempering a substrate using the furnace.

BACKGROUND OF THE INVENTION

In order to provide furnaces with a high capacity, tunnel furnaces or continuous furnaces are used. A continuous furnace is a continuously operating furnaces in which the material, e.g. a metal material, to be heated is fed into the furnace at an inlet, then passes through the furnace heating section and is finally removed through an outlet.

Typically, a continuous furnace comprises several heating sections which are arranged one after another along a transportation direction of the material to be heated. For example, a continuous furnace comprises a pre-heating zone, a firing zone and a cooling zone which are arranged one after another along the transport direction of the material.

In order to transport the material through the continuous furnace, the material is supported onto furnace rollers, or other means along which the material rolls along the transport direction. Specifically, the rollers are driven, e.g. by a driving belt, in order to transport the material along the transport direction through the furnace.

For heating the material within a heating zone, a heating gas or process gas is injected into the respective heating zone. Due to the design of the continuous furnace, i.e. the inlet and outlet openings, it is complex to isolate the heating gas from an environment of the furnace. Hence, an accurate temperature control of a continuous furnace, as well as an energy efficient continuous furnace, is desired.

SUMMARY OF THE INVENTION

It is an object of the present invention to provide a more efficient and accurate furnace for controlling a temperature of a material.

This object is solved by a furnace, in particular, a continuous furnace, and by a method of controlling a temperature of a substrate by a furnace.

According to a first aspect of the present invention, a furnace, in particular, a continuous furnace, for controlling a temperature of at least one substrate is presented. The furnace comprises a housing and a temperature controlling element. The housing comprises an intake opening and an outtake opening, wherein between the intake opening and the outtake opening a temperature-controlled section is formed. A carrier element for carrying the at least one substrate is movable along a transport direction through the intake opening into the temperature-controlled section and from the temperature-controlled section through the outtake opening. A temperature controlling element is thermally coupled to the temperature-controlled section for controlling a temperature of the temperature-controlled section, i.e. by radiation or absorption. The temperature-controlled section comprises a gas inlet through which a gas is blowable for controlling the temperature of the temperature-controlled section, i.e. by convection.

According to a further aspect of the present invention, a method for controlling a temperature of at least one substrate by a furnace is presented. According to the method, a carrier element for carrying the at least one substrate is moved along a transport direction through an intake opening into a temperature-controlled section and from the temperature-controlled section through the outtake opening. The furnace comprises a housing which comprises the intake opening and the outtake opening, wherein between the intake opening and the outtake opening the temperature-controlled section is formed. Furthermore, according to the method, the temperature of the temperature-controlled section is controlled by (radiation or absorption of thermal energy of) a temperature controlling element which is thermally coupled to the temperature-controlled section. Furthermore, a gas for (i.e. convectively) controlling a temperature of the temperature-controlled section is blown through a gas inlet into the temperature-controlled section.

The furnace comprises the housing which comprises the intake opening and the outtake opening. Between the intake opening and the outtake opening, the temperature-controlled section is formed. The temperature-controlled section may be temperature controlled (heated or cooled) in order to provide a desired temperature inside the temperature-controlled section for controlling a temperature of the substrate, respectively. The housing may form a tunnel, through which the at least one substrate is transported during the heating and/or cooling process. The housing may be made of a thermal isolating material in order to isolate the volume inside the temperature-controlled section from an environment surrounding the housing.

The housing may comprise one or a plurality of temperature-controlled sections. Each temperature-controlled section may be arranged one after another along the transport direction, with which the substrate is transported through the housing. Each temperature-controlled section may comprise a respective intake opening and a respective outtake opening. Furthermore, each temperature-controlled section may comprise a desired temperature, such that the at least one substrate may be temperature controlled (i.e. heated or cooled) within each temperature-controlled section with a desired temperature. For example, along a transport direction, a first temperature-controlled section may be a pre-heating zone, a following further temperature-controlled section may be a heating section, where for example the maximum temperature of the substrate is reached, and a subsequent temperature-controlled section may be a cooling section, where the heated substrate may be cooled with a desired temperature gradient (temperature per time, e.g. T/s).

The substrate to be heated may be, for example, a ceramic element or a metal element. The metal element may be, in particular, a metal plate. For example, the metal plate may be pre-coated with desired alloy materials, such as aluminium, silicone or other desired alloy materials.

The temperature-controlled section may be for example heated between 200° to 1000° Celsius, in particular, to 2100° Celsius.

The carrier element is movable through the housing. The carrier element comprises a carrier section onto which the substrate is located. The carrier element may for example comprise a rectangular, round and/or a cup-like shape. The carrier element may be made of a high temperature resistant material, such as ceramic material. The carrier element is made of a robust and non-flexible and non-elastic deformable material.

Furthermore, the carrier element may comprise a flat bottom, by which the carrier element contacts the bottom of the housing. For example, the bottom comprises a low roughness for providing a low friction between the bottom of the carrier element and the bottom of the housing such that the carrier element slides along the bottom. In a further exemplary embodiment, the carrier element may comprise rollers onto its bottom in order to provide a low friction between the carrier element and the bottom of the housing.

In order to achieve an accurate and efficient temperature control of the temperature-controlled section, the approach of the present invention is to provide both, a radiation heating and convection heating. The radiation heating is provided by the temperature controlling element which is thermally coupled to the temperature controlled section. A thermal coupling (i.e. a thermal interaction and a thermal energy exchange between the temperature controlling element and the inner volume of the temperature controlled section) may be achieved e.g. by arranging the temperature controlling element inside the temperature-controlled section. Furthermore, the temperature controlling element may be an integral part or a section of the housing itself, which is heated by external heating devices. For example, a section of the housing may form the temperature controlling element which is heated from an outside of the housing located heater or cooler.

The convection heating is provided by the gas inlet, which is formed into the housing, through which the gas is flowable for controlling the temperature of the temperature-controlled section.

In conventional approaches, continuous furnaces use convection heating, where a high mass flow of gas has to be provided inside the temperature-controlled section for adjusting accurately a temperature.

Hence, the high amount of gas has to be heated, so that the efficiency is reduced.

By the approach of the present invention, besides the convection heating, additionally a temperature controlling element provides radiation heating, so that the mass flow and hence the amount of gas may be reduced, wherein the temperature in the temperature-controlled section is still adjustable correctly.

The temperature controlling element may be for example a plate-like element which comprises a large thermal radiation surface and/or thermal absorption surface, respectively. The material of the temperature controlling element may comprise a heat transfer coefficient of more than 50 W/(m*K), in particular more than 90 W/(m*K). The temperature controlling element may be formed for example of a metal material in order to provide proper heat transfer characteristics.

The temperature controlling element may be for example arranged at a bottom, a top wall or a sidewall of the housing. Furthermore, the temperature controlling element may be coupled to an electric power source such that the temperature controlling element forms part of an electric heater.

Alternatively or additionally, the temperature controlling element may comprise a plurality of radiation tubes through which a heating fluid, such as heating gas or a heating liquid, may flow. Alternatively, through the radiation tubes, also a cooling fluid, such as a cooling liquid or a cooling gas, if the temperature-controlled section is arranged for cooling the substrate. The temperature controlling element may also be arranged at the bottom of the housing and a below described carrier element for carrying the substrate may be slid or guided over the temperature controlling element along the transport direction. Hence, the carrier element heats up by the radiation heat from the temperature controlling element. Hence, the carrier element acts itself as a temperature controlling element and heats the substrate by radiation.

The gas inlet may be formed within the housing, in particular within the bottom, the top or a sidewall of the housing such that the gas is injectable into the temperature-controlled section. The gas may be for example heated or cooled air from the environment or process gas. Furthermore, the gas (i.e. the process gas) may be for example an inert gas, such as nitrogen. For example, a compressor, such as an air blower, specifically a radial blower may provide the gas with a desired pressure such that the gas is injectable through the gas inlet inside the temperature-controlled section.

According to a further exemplary embodiment, the temperature controlling element is arranged within the temperature-controlled section such that the gas is flowable against or through the temperature controlling element for controlling a temperature of the temperature controlling element. The temperature controlling element may comprise a plate-like shape, which may act as an air deflector. If the gas is guided against or through the temperature controlling element, the temperature controlling element heats up or cools down, respectively, and the temperature controlling element controls the temperature of the temperature-controlled section with the desired temperature, in particular by radiation or absorption. Hence, turbulences in the atmosphere of the temperature-controlled section may be reduced, because the temperature controlling element guides the gas along a predetermined direction.

According to a further exemplary embodiment, the gas inlet is formed in such a way that the gas is flowable against the substrate in such a way that the substrate is liftable in particular from the carrier element.

Specifically, the housing comprises a bottom which comprises the gas inlet, wherein the gas is flowable from the bottom against the substrate in such a way that the substrate is liftable from the bottom.

Specifically, the gas inlet is arranged within the housing, in particular the bottom, in such a way that the lifting force caused by the injected gas acts at the substrate against the gravity force of the substrate, such that the substrate is lifted and floats. Hence, the substrate may be free of any contact with part of the housing or carrier. Hence, mechanical defects or non-uniform heating up or cooling down due to a contact of the substrate caused by hits against a holding structure of the substrate, such as a housing wall or a below described carrier element, may be reduced.

The lifting force generated by the injected gas may be controlled by controlling the mass flow of the gas. The mass flow of the gas is controlled by a compressor and by the opening characteristics of the gas inlet of the housing. For example, the gas inlet may form a nozzle or a pattern of nozzles in order to generate an adequate lifting force of the substrate.

Furthermore, the location of the substrate within the temperature-controlled section may be identified by position sensors, such as cameras. Furthermore, the lifting force of the mass flow may be controlled by pressure sensors within the temperature-controlled section. A control unit, to which the respective sensors and the compressor are coupled, may control the lifting and floating position of the substrate.

According to a further exemplary embodiment, the gas inlet is arranged within the temperature-controlled section in such a way, that the gas is blowable against the substrate with a streaming direction which comprises a component parallel or perpendicular with respect to the transport direction. Hence, the gas inlet maybe arranged at a sidewall of the housing and the temperature-controlled section, respectively, such that the gas inlet comprise a streaming direction which is non-parallel with respect to the direction of the force of gravity. Hence, the gas streams along a surface of the substrate. Alternatively, the gas inlet may be arranged in the bottom of the housing and the temperature controlling element deflects the gas to a desired direction of the gas flow.

According to a further exemplary embodiment, the temperature-controlled section comprises a gas outlet for draining off the gas from the temperature-controlled section.

According to a further exemplary embodiment, at least one of the intake opening and the outtake opening comprises a further gas inlet through which a barrier gas is injectable such that a gas barrier is generated for isolating the temperature-controlled section from a surrounding environment of the temperature-controlled section and in particular from an adjoining temperature-controlled section which is arranged upstream or downstream to the temperature controlled section.

The barrier gas may be for example air or an inert gas, such as nitrogen. The barrier gas streams through the respective intake opening or the respective outtake opening such that the gas barrier is generated. Hence, gas from the temperature-controlled section is prevented from passing the gas barrier and hence may be prevented from streaming out of the temperature-controlled section. Hence, although an opening, i.e. an intake opening and an outtake opening in the housing, is provided, gas is prevented from flowing out of the temperature-controlled section.

According to a further exemplary embodiment, the furnace further comprises a further temperature controlling element which is arranged inside the temperature-controlled section for controlling the temperature of the temperature-controlled section. The further temperature controlling element is arranged with respect to the temperature controlling element in such a way that the substrate passes an area between the temperature controlling element (e.g. an upper heating or cooling element) and the further temperature controlling element (e.g. a lower heating or cooling element) when being moved along the transport direction between the intake opening and the outtake opening.

The further temperature controlling element may be formed and designed in the same manner as the above described temperature controlling element. The further temperature controlling element is arranged within the temperature-controlled section in such a way that the substrate is arranged between both, the temperature controlling element and the further temperature controlling element. Hence, a homogeneous tempering of the substrate is provided.

According to a further exemplary embodiment, the carrier element comprises a carrier bottom onto which the substrate is arrangeable, wherein the carrier bottom comprises a passage through which the gas is flowable against the substrate.

The bottom of the carrier element may comprise for example a passage, such as a pattern of holes or for example a mesh or a lattice, such that the gas may flow through the bottom of the carrier element and hence heat the substrate by convection. Moreover, the gas flows through the bottom of the carrier element such that the substrate may float above the bottom.

According to a further exemplary embodiment, the furnace comprises a force transmitting element which is coupled to the carrier element such that the force transmitting element transfers a driving force to the carrier element for driving the carrier element along the transport direction. The force transmitting element is movable along the transport direction.

The force transmitting element may be for example a push rod or a pull rod which pulls or pushes, respectively, the carrier element along the transport direction. The force transmitting element may be in an exemplary embodiment a further carrier element which is coupled by a frictional contact or by a form fit contact to the carrier element. In a further exemplary embodiment, a plurality of further carrier elements maybe arranged along the transport direction one after another in a force transmitting manner. Hence, the plurality of carrier elements may form a chain, for example. The first or the last carrier element of the chain may be coupled to a driving unit which transfers a driving force to the other carrier elements of the chain. In a further exemplary embodiment, the plurality of carrier elements of the chain are coupled to each other in an exchangeable and removable manner, such that the last carrier element with respect to the transport direction may be removed from the chain and attached to the first carrier element of the chain.

The force transmitting element may be coupled to a driving unit which is located in an exemplary embodiment outside of the housing, e.g. within the environment and hence out of the temperature-controlled section and e.g. out of the housing. The force transmitting element is coupled in particular to sections of the respective carrier element arrangements, which are located out of the respective temperature controlled sections. The force transmitting element comprises for example a pull rod or a push rod. Alternatively, the force transmitting element may extend in an exemplary embodiment from the environment through the intake opening of the housing inside the temperature-controlled section. Alternatively, the force transmitting element extends from the inside of the temperature-controlled section through the outtake opening outside of the housing, e.g. if the force transmitting element is a pull rod.

The driving unit is for example an electrical or hydraulic motor, which generates the driving force which is transmitted by the force transmitting element to the carrier element. The driving unit may generate a constant driving force such that the carrier element is driven through the housing along the transport direction continuously. Alternatively, the driving unit may generate a sequential driving force, such that the carrier element is moved along the transport direction sequential. Hence, the carrier element rests for a predetermined time in a desired position and is moved in a next step to another desired location was in the housing. Specifically, the driving unit generates a driving force with a component along a translatory direction, i.e. along the transport direction.

As described above, according to an exemplary embodiment, the force transmitting element is a further carrier element for carrying a further substrate.

As described above, according to an exemplary embodiment, the force transmitting element is coupled to the carrier element such that the driving force is a (translatory) pushing force which is transferrable from the force transmitting element to the carrier element.

As described above, according to an exemplary embodiment, the force transmitting element is coupled to the carrier element such that the driving force is a (translatory) pulling force which is transferrable from the force transmitting element to the carrier element.

According to a further exemplary embodiment, a plurality of force transmitting elements may be applied. For example, one force transmitting element transfers a pulling force to the carrier element and another further force transmitting element transfers a pushing force to the carrier element.

According to a further exemplary embodiment, the force transmitting element is coupled to the carrier element by a form fit connection, in particular, a dove tail connection. Furthermore, the force transmitting element comprises a contact surface and the carrier element comprises a further contact surface, such that both contact surfaces may provide a frictional contact, wherein the driving force may be transferred along the direction of the respective normals of the respective contact surfaces between the force transmitting element and the carrier element.

As described above, according to a further exemplary embodiment, a driving unit which is arranged outside of the housing is provided. The force transmitting element is coupled to the driving unit such that the driving force is transferred from the driving unit via the force transmitting element to the carrier element.

According to a further exemplary embodiment, wherein the housing comprises a guiding system for guiding the carrier element through the housing, wherein the carrier element is coupled to the guiding system such that the carrier element is guidable along the transport direction.

The guiding system comprises for example at least one guiding rail, wherein the respective carrier element may be coupled to the guiding rail. The carrier element may be formed for sliding along the guiding rail. Furthermore, the guiding rail or the respective carrier elements may comprise rollers, such that the carrier element may roll along the guiding rail.

Alternatively, the guiding system may comprise a plurality of supporting sheets which are arranged along the bottom of the housing. The supporting sheets may comprise a smooth and even surface in order to provide a low friction between the carrier element and the respective supporting sheets. The carrier element may slide along the respective supporting sheets due to the low friction between the carrier element and the supporting sheets.

Hence, the carrier element is arranged onto the bottom such that the carrier element is slideable onto the bottom along the transport direction. Hence, driven rollers or other driving means may be obsolete to be arranged inside the housing. Specifically, if the force transmitting element is a push rod or a pull rod, the driving force acts along a translatory direction from outside of the housing to the inside of the housing and pulls or pushes, respectively, the carrier element along the transport direction.

The bottom of the housing and/or the bottom of the respective carrier elements may be formed smooth and comprise a low roughness for providing a proper slidable contact between each other. As described above, the supporting sheets may be arranged onto the bottom surface.

According to a further exemplary embodiment, the furnace comprises a carrier element arrangement comprising at least the carrier element for carrying the substrate, wherein the carrier element arrangement comprises a first end and a second end. The carrier element arrangement is formed and arrangable within the housing such that the first end is located within the intake opening and the second end is located within the outtake opening.

According to a further exemplary embodiment, the at least one carrier element comprises a first edge section, a second edge section and a recess within the at least one substrate is carriable. The recess is formed along the transport direction between the first edge section and the second edge section, wherein the first edge section forms the first end of the carrier element arrangement.

According to a further exemplary embodiment, the second edge forms the second end of the carrier element arrangement. Hence, the carrier element may be formed and may be arrangable within the housing such that the first edge section is located within the intake opening, the second edge section is located within the outtake opening and the recess is located within the temperature-controlled section.

The at least one carrier element of the carrier element arrangement is designed and formed in such a way, that, if the recess of the carrier element, into which the substrate or the plurality of substrates is carried, is located within the temperature-controlled section of the furnace, a first edge section, e.g. the first end, is located within the intake opening and a second edge section, e.g. the second end, is located within the outtake opening. The first edge and the second edge may comprise a larger width of the carrier element than the recess. In other words, the first edge and the second edge may be protrusions, i.e. thicker sections, of the carrier element with respect to the recess (thickness) of the carrier element. However, in an alternative embodiment, the first edge and the second edge may comprise a similar width of the carrier element with respect to the recess.

According to a further exemplary embodiment, the carrier element arrangement comprises a plurality of carrier elements for carrying a plurality of substrates, wherein each of the carrier elements comprises a respective first edge section, a respective second edge section and a respective recess into which at least one substrate is carriable. The respective second edge section forms the second end of the carrier element arrangement.

The first end and the second end are formed at opposite ends of the carrier element arrangement with respect to the transport direction. The respective first edge and the respective second edge are formed at opposite ends of a respective carrier element with respect to the transport direction.

Hence, the carrier element arrangement provides a proper isolation of the housing, in particular of the temperature-controlled section, because if the recess of the at least one carrier element of the carrier element arrangement is located within the temperature-controlled section, the first end and the second end of the carrier element arrangement are located at the respective intake opening and the respective outtake opening. If the first end is located within the intake opening and the second end is located at the outtake opening, the size and respectively the gaps between the respective first and second ends of the carrier element arrangement and the respective intake or outtake openings are reduced, so that the flow volume, through which a gas may flow from the temperature-controlled section to the environment, is reduced.

According to a further exemplary embodiment, the first end is dimensioned in such a way that the first end may form a loose fit connection with the intake opening of the housing, so that no or only a small gap between the first end and the intake opening exists. Accordingly, according to a further exemplary embodiment, the second end is dimensioned in such a way that the second end may form a loose fit connection with the outtake opening of the housing, so that no or only a small gap between the second end and the intake opening exists.

According to a further exemplary embodiment, the carrier element is moveable along a transport direction through the intake opening into the temperature-controlled section and from the temperature-controlled section through the outtake opening.

According to a further exemplary embodiment, the housing comprises a further outtake opening and a further temperature-controlled section, wherein the further temperature-controlled section is formed between the outtake opening and the further outtake opening along the transport direction, g. Hence, as described above, the housing may comprise a plurality of temperature-controlled sections which are separated by respective outtake openings. Each temperature-controlled section may be isolated from each other by respectively arranged ends of the carrier element arrangement within the respective temperature-controlled sections.

According to a further exemplary embodiment, the furnace comprises a further carrier element arrangement comprising at least one further carrier element for carrying a further substrate, wherein the further carrier element arrangement comprises a further first end and a further second end. The further carrier element arrangement is formed and arrangable within the housing such that the further first end is located within the outtake opening and the further second end is located within the further outtake opening.

The further carrier element arrangement may comprise one or a plurality of further carrier elements which are coupled one after another along the transport direction and which recesses are arranged within the further temperature-controlled section. The second end of the carrier element arrangement may contact or may be coupled to the further first end of the further carrier element arrangement.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWINGS

The invention will be described in more detail hereinafter with reference to examples of embodiments but to which the invention is not limited.

DETAILED DESCRIPTION OF THE INVENTION

Figure 1:
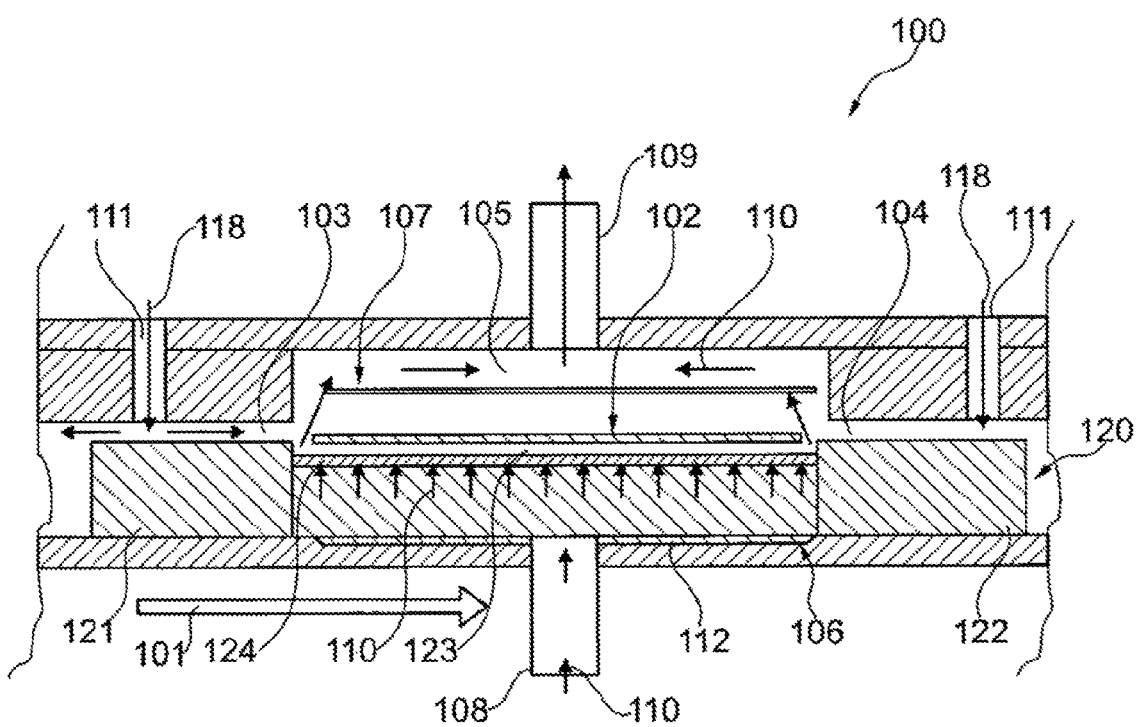
FIG. 1 shows a schematic view of a furnace comprising a temperature controlling element and a gas inlet according to an exemplary embodiment of the present invention.

The illustrations in the drawings are schematically. In different drawings similar or identical elements are provided with the same reference signs.

FIG. 1 shows a furnace, in particular a continuous furnace, for controlling a temperature of at least one substrate 102. A housing 100 comprises an intake opening 103 and an outtake opening 104, wherein between the intake opening 103 and the outtake opening 104 a temperature-controlled section 105 is formed.

A carrier element 120 for carrying the at least one substrate 102 is movable along a transport direction 101 through the intake opening 103 into the temperature-controlled section 105 and from the temperature-controlled section 105 through the outtake opening 104. A temperature controlling element 106 is arranged inside the temperature-controlled section 105 for controlling a temperature of the temperature-controlled section 105. The temperature-controlled section 105 comprises a gas inlet 108 through which a gas 110 is blowable for controlling a temperature of the temperature-controlled section 105.

The temperature-controlled section 105 may be temperature controlled (e.g. heated or cooled) in order to provide a desired temperature inside the temperature-controlled section 105 for controlling a temperature of the substrate 102 with a desired temperature, respectively. The housing 100 forms a tunnel, through which the substrate 102 is transported during the tempering process. The temperature-controlled section 105 may be for example tempered between 200° to 2000° Celsius.

The temperature controlling element 106 may be for example a plate-like element which comprises a large thermal radiation surface. The temperature controlling element 106 is arranged at a bottom 112 or a sidewall of the housing 100. Furthermore, the temperature controlling element 106 may be coupled to an electric power source such that the temperature controlling element 106 forms part of an electric heating.

Alternatively or additionally, the temperature controlling element 106 may comprise a plurality of radiation tubes through which a heating fluid, such as heating gas or a heating liquid, may flow.

Alternatively, through the radiation tubes, also a cooling fluid, such as a cooling liquid a cooling gas, if the temperature-controlled section 105 is arranged for cooling the substrate 102. The temperature controlling element 106 may be arranged at the bottom 112 of the housing 100 and a below described carrier element 120 for carrying the substrate 102 may be slid or guided over the temperature controlling element 106 along the transport direction 101. Hence, the carrier element 120 heats up by the radiation heat from the temperature controlling element 106. Hence, the carrier element 120 acts itself as a temperature controlling element and heats the substrate 102 by radiation.

Furthermore, the temperature controlling element 106 may act as an absorption element for absorbing thermal energy in order to cool the substrate 102.

The gas inlet 108 is formed within the bottom 112. The gas 110 is for example air having a predetermined temperature from the environment. Furthermore, the gas 110 may be for example an inert gas having a predetermined temperature, such as nitrogen. For example, a compressor, such as an air blower may provide the gas 110 with a desired pressure such that the gas 110 is injectable through the gas inlet 108 inside the temperature-controlled section 105.

The temperature controlling element 106 is arranged within the temperature-controlled section 105 such that the gas 110 is flowable against the temperature controlling element 106 for controlling the temperature of the temperature controlling element 106. The temperature controlling element 106 may comprise a plate-like shape, which may act as an air deflector. If the gas 110 is guided against the temperature controlling element 106, the temperature controlling element 106 heats up or cools down, respectively, and the temperature controlling element 106 controls the temperature of the temperature-controlled section 105 with the desired temperature.

Furthermore, the gas 110 is flowable against the carrier element 120 for controlling a temperature of the carrier element 120.

Furthermore, as shown in FIG. 1, the gas 110 is flowable from the bottom 112 against the substrate 102 in such a way that the substrate 102 is liftable from the bottom 112. Specifically, the gas inlet 108 is arranged within the housing 100, in particular the bottom 112, in such a way that the lifting force caused by the injected gas 110 acts at the substrate 102 against the gravity force of the substrate 102, such that the substrate 102 is lifted and floats. Hence, the substrate 102 may be free of any contact with part of the housing 100. Hence, mechanical defects (and e.g. non-uniform heating/cooling) of the substrate 102 caused by hits against a holding structure of the substrate 102, such as a housing 100 wall or a below described carrier element 120, may be reduced.

The lifting force generated by the injected gas 110 may be controlled by controlling the mass flow of the gas 110. The mass flow of the gas 110 is controlled by a compressor and by the opening characteristics of the gas inlet 108 of the housing 100. For example, the gas inlet 108 may form a nozzle or a pattern of nozzles in order to generate an adequate lifting force of the substrate 102.

Furthermore, the location of the substrate 102 within the temperature-controlled section 105 may be identified by position sensors, such as cameras. Furthermore, the lifting force of the mass flow may be controlled by pressure sensors within the temperature-controlled section 105. A control unit, to which the respective sensors and the compressor are coupled, may control the lifting and floating position of the substrate 102.

Furthermore, the gas 110 may be directed, e.g. by the temperature controlling element 106 acting as a deflector, along a surface of the substrate 102.

The temperature-controlled section 105 comprises a gas outlet 109 for draining off the gas 110 from the temperature-controlled section 105.

Furthermore, the intake opening 103 and the outtake opening 104 comprise a further gas inlet 111, respectively, through which a barrier gas 118 is injectable such that a gas barrier is generated for insulating the temperature-controlled section 105 from an environment of the temperature-controlled section 105.

The barrier gas 118 may be for example air or an inert gas, such as nitrogen. The barrier gas 118 streams through the respective intake opening 103 or the respective outtake opening 104 such that the gas barrier is generated. Hence, gas 110 from the temperature-controlled section 105 is prevented from passing the gas barrier and hence may be prevented from streaming out of the temperature-controlled section 105. Hence, although an opening, i.e. an intake opening 103 and an outtake opening 104 in the housing 100, is provided, gas 110 is prevented from flowing out of the temperature-controlled section 105.

Furthermore, as shown in FIG. 1, the furnace further comprises a further temperature controlling element 107 which is arranged inside the temperature-controlled section 105 for controlling a temperature of the temperature-controlled section 105. The further temperature controlling element 107 is arranged with respect to the temperature controlling element 106 in such a way that the substrate 102 passes an area between the temperature controlling element 106 and the further temperature controlling element 107 when being moved along the transport direction 101 between the intake opening 103 and the outtake opening 104.

The further temperature controlling element 107 may be formed and designed in the same manner as the above described temperature controlling element 106. The further temperature controlling element 107 is arranged within the temperature-controlled section 105 in such a way that the substrate 102 is arranged between both, the temperature controlling element 106 and the further temperature controlling element 107. Hence, a homogeneous tempering of the substrate 102 is provided.

As shown in FIG. 1, the substrate 102 is supported by the carrier element 120 for carrying the substrate 102, wherein the carrier element 120 is moveable along the transport direction 101 through the intake opening 103 into the temperature-controlled section 105 and from the temperature-controlled section 105 through the outtake opening 104.

The carrier element 120 is movable through the housing 100. The carrier element 120 comprises a carrier section onto which the substrate 102 is located. The carrier element 120 may for example comprise a rectangular, round and/or a cup-like shape. The carrier element 120 may be made of a high temperature resistant material, such as ceramic, CFC, graphite or metal material. Furthermore, the carrier element 120 may comprise a flat bottom 112, by which the carrier element 120 stands onto the bottom 112 of the housing 100. For example, the bottom 112 comprises a low roughness for providing a low friction between the bottom 124 of the carrier element 120 and the bottom 112 of the housing 100. For example, the carrier element 120 may comprise rollers onto its carrier bottom 124 in order to provide a low friction between the carrier element 120 and the bottom 112 of the housing 100.

Furthermore, the carrier element 120 comprises a carrier bottom 124 onto which the substrate 102 is arrangable, wherein the carrier bottom 124 comprises a passage through which the gas 110 is flowable against the substrate 102.

The bottom 124 of the carrier element 120 may comprise for example a passage, such as a pattern of holes or for example a mesh or a lattice, such that the gas 110 may flow through the bottom 124 of the carrier element 120 and hence heat the substrate 102 by convection. Moreover, the gas 110 flows through the bottom 124 of the carrier element 120 such that the substrate 102 may float above the carrier bottom 124.

The carrier element 120 comprises a first edge section 121, a second edge section 122 and a recess 123 into which the substrate 102 is carriable. The recess 123 is formed along the transport direction 101 between the first edge section 121 and the second edge section 122, wherein the carrier element 120 is formed and arrangable within the housing 100 such that the first edge section 121 is located within the intake opening, the second edge section 122 is located within the outtake opening 104 and the recess 123 is located within the temperature-controlled section 105.

The carrier element 120 is designed and formed in such a way, that, if a recess 123 of the carrier element 120 into which the substrate 102 is carried is located within the temperature-controlled section 105 of the furnace, a first edge section 121, e.g. an end section, is located within the intake opening 103 and a second edge section 122, e.g. a further end section, is located within the outtake opening 104. The first edge section 121 and the second edge section 122 may comprise a larger width of the carrier element 120 than the recess 123. In other words, the first edge section 121 and the second edge section 122 may be protrusions of the carrier element 120 with respect to the recess 123 of the carrier element 120. However, in an alternative embodiment, the first edge section 121 and the second edge section 122 may comprise a similar width of the carrier element 120 with respect to the recess 123.

The first edge section 121 and the second edge section 122 are formed at opposite ends of the carrier element 120 with respect to the transport direction 101.

Hence, the carrier element 120 provides a proper isolation of the housing 100, in particular of the temperature-controlled section 105, because if the recess 123 of the carrier element 120 is located within the temperature-controlled section 105, the first edge section 121 and the second edge section 122 are located at the respective intake opening 103 and the respective outtake opening 104. If the first edge section 121 is located within the intake opening 103 and the second edge section 122 is located at the outtake opening 104, the size and respectively the gaps between the respective first and second edges 121, 122 and the respective intake or outtake openings 103, 104 are reduced, so that the flow volume, through which a gas 110 may flow from the temperature-controlled section 105 to the environment, is reduced.

The carrier element 120 is moveable along the transport direction 101 through the intake opening 103 into the temperature-controlled section 105 and from the temperature-controlled section 105 through the outtake opening 104.

Figure 2:
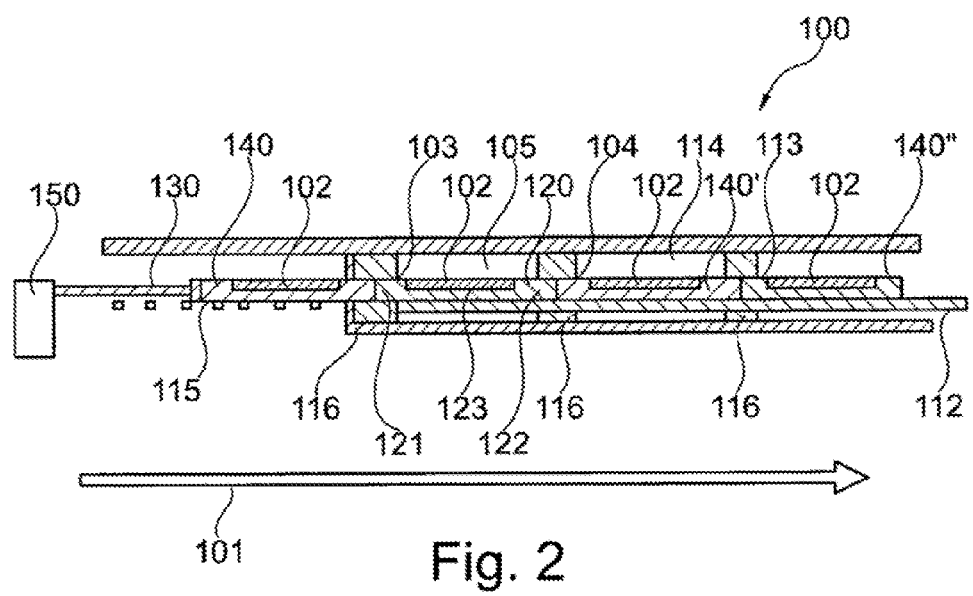
FIG. 2 shows a schematic view of a furnace comprising a carrier element and a forced transmitting element according to an exemplary embodiment of the present invention.

FIG. 2 shows the housing 100 with a plurality of temperature-controlled sections 105, 114. Each temperature-controlled section 105, 114 may be arranged one after another along the transport direction 101, through which the substrate 102 is transportable through the housing 100. Each temperature-controlled section 105, 114 comprises a respective intake opening 103 and a respective outtake opening 104, 113. Furthermore, each temperature-controlled section 105, 114 may comprise a desired temperature, such that the substrate 102 or a plurality of further substrates 102 may be heated or cooled within each temperature-controlled section 105, 114 with a desired temperature. For example, along a transport direction 101, a first temperature-controlled section 105 may be a pre-heating zone, a following further temperature-controlled section 114 may be a heating section, where for example the maximum temperature of the substrate 102 is reached, and a subsequent temperature-controlled section (not shown in FIG. 2) may be a cooling section, where the heated substrate 102 may be cooled with a desired temperature gradient (temperature per time, e.g. T/s).

A carrier element arrangement is arranged within the tempering section 105 and a further carrier element arrangement may be arranged inside the further tempering section 114. The carrier element arrangement comprises at least one carrier element 120 and the further carrier element arrangement comprises at least one further carrier element 140. Each carrier element arrangement comprises a first end and a second end.

The carrier element arrangement is formed and arranged within the housing 100 such that the first end is located within the intake opening 103 and the second end is located within the outtake opening 104.

The housing 100 comprises the further outtake opening 113 and the further temperature-controlled section 114, wherein the further temperature-controlled section 114 is formed between the outtake opening 104 and the further outtake opening 113. The further carrier element arrangement is formed and arrangable within the housing 100 such that the further first end of the further carrier element arrangement is located within the outtake opening 104 and the further second end of the further carrier element arrangement is located within the further outtake opening 113.

The at least one carrier element 120 of the carrier element arrangement comprises a first edge section 121, a second edge section 122 and a recess 123 within the substrate 102 is carriable, wherein the recess 123 is formed along the transport direction 101 between the first edge section 121 and the second edge section 122. The first edge section 121 forms the first end of the carrier element arrangement.

In the exemplary embodiment shown in FIG. 2, the second edge section 122 of the carrier element 120 forms the second end of the carrier element arrangement. Alternatively, the carrier element arrangement may comprise a plurality of carrier elements 120 located within a common temperature controlled section 105, wherein the second edge section 122 of the carrier element 120 which is located at the downstream end of the carrier element arrangement with respect to the transport direction 101 forms the second end of the carrier element arrangement.

The respective further carrier element 140 of the further carrier element arrangement comprises a further first edge section 121', a further second edge section 122 and a further recess 123 into which the further substrate 102 is carriable. The further recess 123 is formed along the transport direction 101 between the further first edge section 121' and the further second edge section 122, wherein the further carrier element 140 is formed and arrangable within the housing 100 such that the further first edge section 121' is located within the outtake opening 104, the further second edge section 122 is located within the further outtake opening 113 and the further recess 123 is located within the further temperature-controlled section 114.

The furnace further comprises a force transmitting element 130 which is coupled to the carrier element arrangements such that the force transmitting element 130 transfers a driving force to the carrier element arrangements and the carrier elements 120, 140, respectively, for driving the carrier elements 120, 140 along the transport direction 101. The force transmitting element 130 is movable along the transport direction 101 the temperature-controlled section 105.

The force transmitting element 130 may be for example a push rod or a pull rod which pulls or pushes, respectively, the carrier element arrangements along the transport direction 101. The force transmitting element 130 may be the further carrier element 140 of the further carrier element arrangement which is coupled by a frictional contact or by a form fit contact to the carrier element 120 of the carrier element arrangement. A plurality of further carrier element arrangements may be arranged along the transport direction 101 one after another in a force transmitting manner. Hence, the plurality of carrier elements 120, 140 of the carrier element arrangements may form a chain, for example. The first or the last carrier element 120, 140 of the chain may be coupled to a driving unit 150 which transfers a driving force to the other carrier elements 120, 140 of the chain. In a further exemplary embodiment, the plurality of carrier elements 120, 140 of the respective carrier element arrangements of the chain are coupled to each other in an exchangeable and removable manner, such that the last carrier element 120, 140 with respect to the transport direction 101 may be removed from the chain and attached to the first carrier element 120, 140 of the chain with respect to the transport direction 101.

The force transmitting element 130 may be coupled to a driving unit 150 which is located outside of the housing 100, e.g. within the environment of the housing 100. Hence, the force transmitting element 130 extends from the environment, e.g. from a feeding section 115 outside of the housing 100, through the intake opening 103 of the housing 100 inside the temperature-controlled section 105. Alternatively, the force transmitting element 130 extends from the inside of the temperature-controlled section 105 through the outtake opening 104 outside of the housing 100, e.g. if the force transmitting element 130 is a pull rod.

The driving unit 150 is for example an electrical or hydraulic motor, which generates the driving force which is transmitted by the force transmitting element 130 to the carrier elements 120, 140. The driving unit 150 may generate a constant driving force such that the carrier elements 120, 140 are driven through the housing 100 along the transport direction 101 continuously. Alternatively, the driving unit 150 may generate a sequential driving force, such that the carrier elements 120, 140 are moved along the transport direction 101 sequential. Hence, the carrier elements 120, 140 rest for a predetermined time in a desired position and are moved in a next step to another desired location was in the housing 100. Specifically, the driving unit 150 generates a driving force with a component along a translatory direction, i.e. along the transport direction 101.

The force transmitting element 130 may be coupled to the carrier element 120, 140 of a respective carrier element arrangement by a form fit connection, in particular a dove tail connection. Furthermore, the force transmitting element 130 comprises a contact surface and the carrier element 120 comprises a further contact surface, such that both contact surfaces may provide a frictional contact, wherein the driving force may be transferred along the direction of the respective normals of the respective contact surfaces between the force transmitting element 130 and the carrier elements 120, 140.

The driving unit 150 is arranged outside of the housing 100. The force transmitting element 130 is coupled to the driving unit 150 such that the driving force is transferred from the driving unit 150 via the force transmitting element 130 to the carrier element 120.

The housing 100 comprises a bottom 112, wherein the carrier element 120, 140 is arranged onto the bottom 112 such that the carrier element 120, 140 is slideable onto the bottom 112 along the transport direction 101. Hence, driven rollers or other driving means may be obsolete to be arranged inside the housing 100. Specifically, if the force transmitting element 130 is a push rod or a pull rod, the driving force acts along a transitory direction from outside of the housing 100 to the inside of the housing 100 and pulls or pushes, respectively, the carrier elements 120, 140 along the transport direction 101.

The bottom 112 of the housing 100 and/or the bottom 124 of the respective carrier elements 120, 140 may be formed smooth and comprise a low roughness for providing a proper slidable contact between each other.

Furthermore, the housing 100 comprises a further outtake opening 113 and a further temperature-controlled section 114, wherein the further temperature-controlled section 114 is formed between the outtake opening 104 and the further outtake opening 113. Hence, as described above, the housing 100 may comprise a plurality of temperature-controlled sections 105, 114 which are separated by respective outtake openings 104, 113. Each temperature-controlled section 105, 114 may be isolated from each other by respectively arranged ends of the carrier element arrangement, i.e. the respective edges 121, 122 of carrier elements 120, 140 of the carrier element arrangements within the respective temperature-controlled sections 105, 114.

Figure 3:
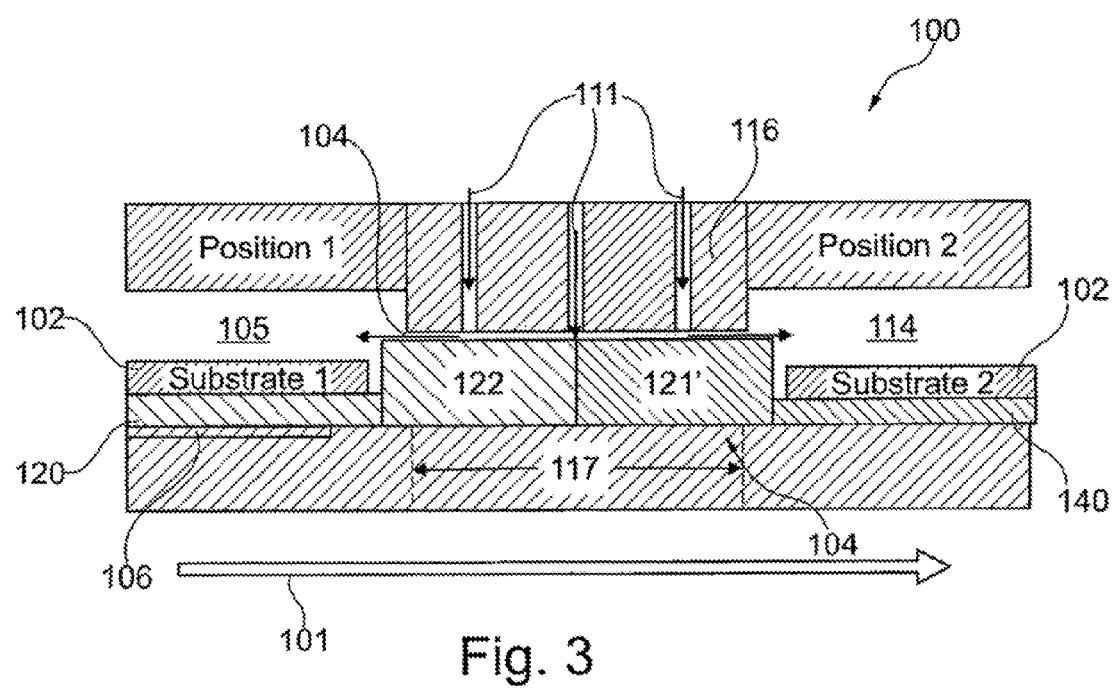
FIG. 3 shows a schematic view of a furnace comprising two carrier elements and an insulation section according to an exemplary embodiment of the present invention.

FIG. 3 shows in more detail two carrier element arrangements, wherein one carrier element arrangement comprises the carrier element 120 and the other carrier element arrangement comprises the carrier element 140. Furthermore, an insulation section 116 (gate section 117) of the housing 100 is shown.

The housing 100 comprises the gate section 117 between two adjacent temperature-controlled sections 105, 114. In the region of the gate section 117, the housing 100 comprises the insulating section 116. The insulating section 116 is for example a section of the housing 100 with a protrusion for providing a small passage (intake or outtake openings 103, 104, 113) through which the respective carrier elements 120, 140 of the respective carrier element arrangements may be guided between adjacent temperature-controlled sections 105, 114. The insulating section 116 may be made of a thermally isolating material.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS 100 housing
101 transport direction
102 substrate
103 intake opening
104 outtake opening
105 temperature-controlled section
106 temperature controlling element
107 further temperature controlling element
108 gas inlet
109 gas outlet
110 gas
111 further gas inlet
112 bottom
113 further outtake opening
114 further temperature-controlled section
115 feeding section
116 insulation section
117 gate section
118 barrier gas
120 carrier element
121 first edge section
122 second edge section
123 recess
124 carrier bottom
130 force transmitting element
140 further carrier element
150 driving unit

The invention claimed is:

1. A furnace, in particular a continuous furnace, for controlling a temperature of at least one substrate, the furnace comprising:
   a housing which comprises an intake opening and an outtake opening, wherein between the intake opening and the outtake opening a temperature-controlled section is formed,
   a carrier element for carrying the at least one substrate, wherein the carrier element is movable along a transport direction through the intake opening into the temperature-controlled section and from the temperature-controlled section through the outtake opening,
   a temperature controlling element which is thermally coupled to the temperature-controlled section for controlling the temperature of the temperature-controlled section, wherein the temperature-controlled section comprises a gas inlet through which a gas is blowable for controlling the temperature of the temperature-controlled section;
   wherein at least one of the intake opening and the outtake opening comprises a further gas inlet through which a barrier gas is injectable such that a gas barrier is generated for isolating the temperature-controlled section from an outside environment of the temperature-controlled section or from an adjoining section of the temperature-controlled section.

2. The furnace according to claim 1, wherein the temperature controlling element is arranged inside the temperature-controlled section such that the gas is flowable against or through the temperature controlling element for controlling the temperature of the temperature controlling element to carry heat convectively to or away from the substrate.

3. The furnace according to claim 1, wherein the gas inlet is formed in such a way that the gas is flowable against the substrate in such a way that the substrate is liftable.

4. The furnace according to claim 1, wherein the gas inlet is arranged in the temperature-controlled section in such a way that the gas is blowable against the substrate with a streaming direction which comprises a component parallel or perpendicular with respect to the transport direction.

5. The furnace according to claim 1, wherein the temperature-controlled section comprises a gas outlet for draining off the gas from the temperature-controlled section.

6. The furnace according to claim 1, further comprising a further temperature controlling element which is arranged inside the temperature-controlled section for controlling the temperature of the temperature-controlled section, wherein the further temperature controlling element is arranged with respect to the temperature controlling element in such a way that the substrate passes an area between the temperature controlling element and the further temperature controlling element when being moved along the transport direction between the intake opening and the outtake opening.

7. The furnace according to claim 1, wherein the carrier element comprises a carrier bottom onto which the substrate is arrangable, wherein the carrier bottom comprises a passage through which the gas is flowable against the substrate.

8. The furnace according to claim 1, further comprising a force transmitting element which is coupled to the carrier element such that the force transmitting element transfers a driving force to the carrier element for driving the carrier element along the transport direction, wherein the force transmitting element is movable along the transport direction.

9. The furnace according to claim 8, wherein the force transmitting element is a further carrier element for carrying a further substrate.

10. The furnace according to claim 8, wherein the force transmitting element is coupled to the carrier element such that the driving force is a pushing force which is transferrable from the force transmitting element to the carrier element.

11. The furnace according to claim 8, wherein the force transmitting element is coupled to the carrier element such that the driving force is a pulling force which is transferable from the force transmitting element to the carrier element.

12. The furnace according to claim 8, wherein the force transmitting element is coupled to the carrier element by a form fit connection, the form-fit connection comprising a dove tail connection.

13. The furnace according to claim 8, further comprising a driving unit which is arranged outside of the housing, wherein the force transmitting element is coupled to the driving unit such that the driving force is transferred from the driving unit via the force transmitting element to the carrier element.

14. The furnace according to claim 1, wherein the housing comprises a guiding system for guiding the carrier element through the housing, wherein the carrier element is coupled to the guiding system such that the carrier element is guidable along the transport direction.

15. The furnace according to claim 1, further comprising a carrier element arrangement comprising at least the carrier element for carrying the substrate, wherein the carrier element arrangement comprises a first end and a second end, wherein the carrier element arrangement is formed and arrangable within the housing such that the first end is located within the intake opening and the second end is located within the outtake opening.

16. The furnace according to claim 15, wherein the at least one carrier element comprises a first edge section, a second edge section and a recess within which the substrate is carriable, wherein the recess is formed along the transport direction between the first edge section and the second edge section, wherein the first edge section forms the first end of the carrier element arrangement.

17. The furnace according to claim 16, wherein the second edge section forms the second end of the carrier element arrangement.

18. The furnace according to claim 16, wherein the carrier element arrangement comprises a further carrier element for carrying a further substrate, wherein the further carrier element comprises a further first edge section, a further second edge section and a further recess into which the further substrate is carriable, wherein the further second edge section forms the second end of the carrier element arrangement.

19. The furnace according to claim 1, wherein the housing comprises a further outtake opening and a further temperature-controlled section, wherein the further temperature-controlled section is formed between the outtake opening and the further outtake opening.

20. The furnace according to claim 19, further comprising a further carrier element arrangement comprising at least one further carrier element for carrying a further substrate, wherein the further carrier element arrangement comprises a further first end and a further second end, wherein the further carrier element arrangement is formed and arrangable within the housing such that the further first end is located within the outtake opening and the further second end is located within the further outtake opening.

21. A method for controlling a temperature of at least one substrate by a furnace, the method comprising:
moving a carrier element for carrying the at least one substrate along a transport direction through an intake opening into a temperature-controlled section and from the temperature-controlled section through the outtake opening, wherein the furnace comprises a housing which comprises the intake opening and the outtake opening, wherein between the intake opening and the outtake opening the temperature-controlled section is formed,
controlling the temperature of the temperature-controlled section by a temperature controlling element which is thermally coupled to the temperature-controlled section,
blowing a gas for controlling the temperature of the temperature-controlled section through a gas inlet into the temperature-controlled section, and
injecting a barrier gas through a further gas inlet defined in at least one of the intake opening and the outtake opening, thereby generating a gas barrier for isolating the temperature-controlled section from an outside environment of the temperature-controlled section or from an adjoining section of the temperature controlled section.

* * * * *